(12) United States Patent
Hassan et al.

(10) Patent No.: US 11,385,484 B2
(45) Date of Patent: Jul. 12, 2022

(54) PHOTONIC TRANSMITTER HAVING III-V GAIN MEDIA AND ADIABATICALLY-COUPLED WAVEGUIDES

(71) Applicant: Commissariat a l'Energie Atomique et aux Energies Alternatives, Paris (FR)

(72) Inventors: Karim Hassan, Grenoble (FR); Yohan Desieres, Grenoble (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 71 days.

(21) Appl. No.: 16/951,407

(22) Filed: Nov. 18, 2020

(65) Prior Publication Data

US 2021/0149228 A1  May 20, 2021

(30) Foreign Application Priority Data

Nov. 18, 2019 (FR) .................................... 19 12820

(51) Int. Cl.
*G02F 1/025* (2006.01)
*G02F 1/225* (2006.01)
(Continued)

(52) U.S. Cl.
CPC ............ *G02F 1/025* (2013.01); *G02F 1/2257* (2013.01); *H01S 5/021* (2013.01); *H01S 5/0265* (2013.01);
(Continued)

(58) Field of Classification Search
CPC .... G02F 1/2257; G02F 1/025; G02F 2201/06; G02F 2201/12; G02F 2202/105;
(Continued)

(56) References Cited

U.S. PATENT DOCUMENTS 9,703,125 B2  7/2017  Fujikata et al.
10,725,324 B2 *  7/2020  Hassan ................. H01S 5/3432
(Continued)

FOREIGN PATENT DOCUMENTS

EP    3 206 079 A1    8/2017
FR    3 041 116 A1    3/2017
(Continued)

OTHER PUBLICATIONS

French Preliminary Search Report dated Jul. 21, 2020 in French Application 19 12820 filed on Nov. 18, 2019 (with English Translation of Categories of Cited Documents & Written Opinion), 10 pages.

(Continued)

*Primary Examiner* — Andrew Jordan
(74) *Attorney, Agent, or Firm* — Oblon, McClelland, Maier & Neustadt, L.L.P.

(57) ABSTRACT

Photonic transmitter, comprising:
  a stack of a first layer, second layer and third layer stacked on top of one another,
  a laser source comprising a first waveguide and a second waveguide.
The stack comprises:
  a fourth layer located on the third layer, the thickness of this fourth layer being comprised between 40 nm and 1 μm in order to obtain adiabatic coupling between the first and second waveguides, and
  a fifth layer located directly on the fourth layer, the second waveguide being entirely structured in a III-V gain medium of this fifth layer.
The first waveguide comprises a first portion made of semiconductor located inside the third layer and that extends as far as to the interface between the third and fourth layers.

10 Claims, 4 Drawing Sheets

(51) Int. Cl.
  *H01S 5/02* (2006.01)
  *H01S 5/026* (2006.01)
  *H01S 5/30* (2006.01)

(52) U.S. Cl.
  CPC ........ *H01S 5/3013* (2013.01); *G02F 2201/06* (2013.01); *G02F 2201/12* (2013.01); *G02F 2202/105* (2013.01)

(58) Field of Classification Search
  CPC ...... H01S 5/021; H01S 5/0265; H01S 5/3013; H01S 5/0215; H01S 5/22; H01S 5/1032; H01S 5/125; H01S 2301/176
  See application file for complete search history.

(56) References Cited

U.S. PATENT DOCUMENTS

| | | |
|---|---|---|
| 2017/0237229 A1 | 8/2017 | Menezo |
| 2019/0243167 A1 | 8/2019 | Menezo et al. |
| 2020/0026105 A1* | 1/2020 | Hassan .................. H01S 5/125 |
| 2021/0149228 A1* | 5/2021 | Hassan ................. H01S 5/0215 |

FOREIGN PATENT DOCUMENTS

| | | |
|---|---|---|
| FR | 3 054 926 A1 | 2/2018 |
| WO | WO 2018/029414 A1 | 2/2018 |

OTHER PUBLICATIONS

Ben Bakir et al., "Heterogeneously Integrated III-V on Silicon Lasers", ECS Transactions, 64 (5), 2014, pp. 211-223.
Ben Bakir et al., "Hybrid Si/III-V lasers with adiabatic coupling", 8$^{th}$ IEEE International Conference on Group IV Photonics, 2011, 3 pages.
Ben Bakir et al., "Electrically driven hybrid Si/III-V Fabry-Perot lasers based on adiabatic mode transformers", Optics Express, vol. 19, No. 11, 2011, 9 pages.
Davenport et al., "Heterogeneous Silicon/III-V Semiconductor Optical Amplifiers", IEEE Journal of Selected Topics in Quantum Electronics, vol. 22, No. 6, 2016, 11 pages.
Dong et al., "Novel integration technique for silicon/III-V hybrid laser", Optics Express, vol. 22, No. 22, 2014, 8 pages.
Duan et al., "Hybrid III-V on Silicon Lasers for Photonic Integrated Circuits on Silicon", IEEE Journal of Selected Topics in Quantum Electronics, vol. 20, No. 4, 2014, 13 pages.
Duan et al., "Hybrid III-V Silicon Photonic Integrated Circuits for Optical Communication Applications", IEEE journal of Selected Topics in Quantum Electronics, vol. 22, No. 6, 2016, 11 pages.
Duprez et al, "1310 nm hybrid InP/InGaAsP on silicon distributed feedback laser with high side-mode suppression ratio", Optics Express, vol. 23, No. 7, 2015, 9 pages.
Ferrotti et al., "O-Band III-V-on-Amorphous-Silicon Lasers Integrated With a Surface Grating Coupler", IEEE Photonics Technology Letters, vol. 28, No. 18, 2016, 4 pages.
Han et al., "Efficient low-loss InGaAsP/Si hybrid MOS optical modulator", Nature Photonics, vol. 11, 2017, 6 pages.
Park et al., "Device and Integration Technology for Silicon Photonic Transmitters", IEEE Journal of Selected Topics in Quantum Electronics, vol. 17, No. 3, 2011, 18 pages.
Sun et al., "Adiabaticity criterion and the shortest adiabatic mode transformer in a coupled-waveguide system", Optics Letters, vol. 34, No. 3, 2009, 3 pages.
Szelag et al., "Hybrid III-V/Si DFB laser integration on a 200 mm fully CMOS-compatible silicon photonics platform", IEEE IEDM17, 2017, 4 pages.
Szelag et al., "Multiple wavelength silicon photonic 200mm R&D platform for 25Gb/s and above applications", SPIE Photonics Europe Conference, 2016, 15 pages.
Yariv et al., "Supermode Si/III-V hybrid lasers, optical amplifiers and modulators: A proposal and analysis", Optics Express, vol. 15, No. 15, 2007, 5 pages.

\* cited by examiner

PHOTONIC TRANSMITTER HAVING III-V GAIN MEDIA AND ADIABATICALLY-COUPLED WAVEGUIDES

The invention relates to a photonic transmitter comprising a laser source and a modulator. Another subject of the invention is a process for fabricating this transmitter.

Known photonic transmitters comprise:
- a semiconductor laser source able to generate an optical signal, and
- a phase modulator produced on the same substrate and able to modulate the optical signal generated by the semiconductor laser source.

Such a transmitter is for example disclosed in patent application US2017237229A1 or FR3054926A1. The transmitter disclosed in this patent application is advantageous in that it employs an electro-optical modulator (EOM) and, more precisely, a hybrid capacitive modulator. Capacitive modulators have an optical bandwidth much broader than electro-absorption modulators (EAM). The optical bandwidth of a modulator is the wavelength range in which this modulator is able to operate.

To produce a capacitive modulator, good capacitive coupling between the lower electrode and the upper electrode of the modulator is required. This requires the thickness of the dielectric layer that separates these two electrodes to be very small, i.e. the thickness of this layer to be comprised between 5 nm and 35 nm.

The invention described here aims to provide a transmitter having the same advantages as that of patent application US2017237229A1, while being simpler to fabricate.

One subject of the invention is therefore such a photonic transmitter according to claim 1.

Another subject of the invention is a process for fabricating the aforementioned photonic transmitter.

The invention will be better understood on reading the following description, provided solely by way of non-limiting example and with reference to the drawings, in which.

In these figures, the same references are used to denote the same elements. In the remainder of this description, the features and functions that are well known to a person skilled in the art are not described in detail.

In this description, detailed examples of embodiments are first described in Section I with reference to the figures. Next, in the following section, Section II, variants of these embodiments are presented. Lastly, the advantages of the various embodiments are presented in Section III.

Section I: Exemplary Embodiments

Figure 1:
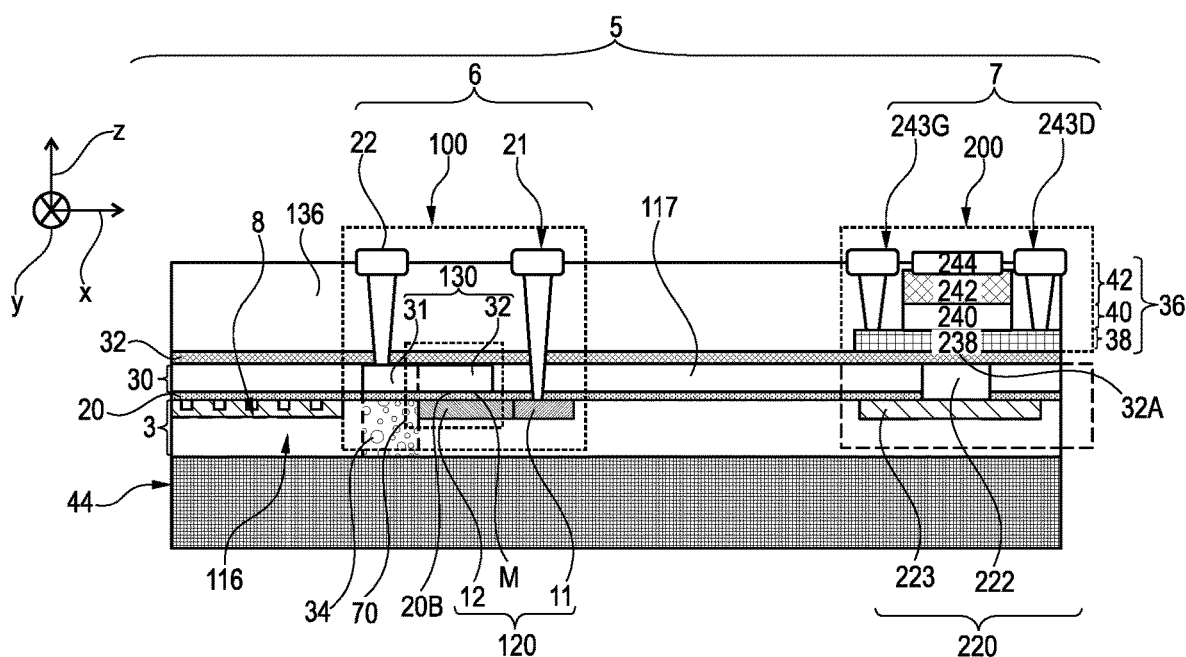
FIG. 1 is a schematic illustration of a transmitter in vertical cross section.
Figure 2:
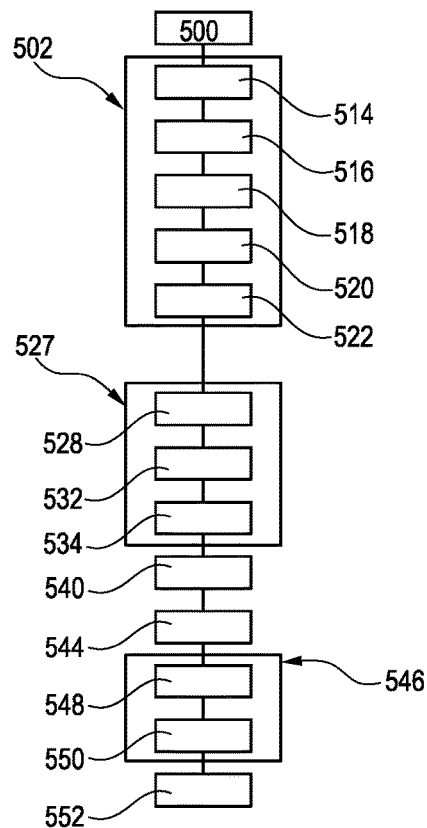
FIG. 2 is a flowchart of a process for fabricating the transmitter of FIG. 1.

FIG. 1 shows a transmitter 5 of a phase and/or amplitude modulated optical signal for transmitting data bits to a receiver via an optical fibre for example. To this end, the transmitter 5 comprises a laser source 7 that emits an optical signal the phase and/or amplitude of which is then modulated by a system 6 for modulating the phase and/or amplitude of this optical signal. For example, the wavelength $\lambda_{Li}$ of the optical signal emitted by the laser source 7 is comprised between 1240 nm and 1630 nm.

FIG. 1 shows the elements of the transmitter 5 in cross section in a vertical plane parallel to the X- and Z-directions.

In FIG. 1 and the following figures, horizontal is represented by the X- and Y-directions of an orthogonal coordinate system. The Z-direction of this orthogonal coordinate system represents the vertical direction. Below, terms such as "upper", "lower", "above", "below", "top" and "bottom" are defined with respect to this Z-direction. The terms "left" and "right" are defined with respect to the X-direction. The terms "front" and "back" are defined with respect to the Y-direction.

Below, the term "thickness" designates the maximum thickness of an element in the Z-direction.

The system 6 may be a system for modulating phase alone, or for modulating amplitude alone or for simultaneously modulating phase and amplitude.

To modulate the phase or amplitude of the optical signal, the system 6 comprises at least one phase modulator and, often, at least one phase-tuning device. For example, the system 6 is a Mach-Zehnder interferometer in which the modulator and the phase-tuning device are arranged in one of the branches of this interferometer to modulate the amplitude and/or phase of the optical signal generated by the laser source 7. The structures of a Mach-Zehnder interferometer and of a phase-tuning device are well known and are not described here in detail. The phase-tuning device is for example the same as that described in patent application US2017237229A1. Therefore, to simplify FIG. 1, only a phase modulator 100 has been shown.

The modulator 100 allows the phase of the optical signal to be rapidly modified. To this end, the modulator 100 is here an electro-optical modulator (EOM) and, more precisely, a hybrid capacitive modulator. It therefore comprises two electrodes 120 and 130 that are located facing each other and that form a capacitor.

The electrode 120 is here made of doped single-crystal silicon. In this embodiment, it is entirely structured in the single-crystal silicon of a layer 3.

The layer 3 comprises single-crystal silicon encapsulated in a dielectric material 116. Generally, a dielectric material has an electrical conductivity at 20° C. that is lower than $10^{-7}$ S/m and, preferably, lower than $10^{-9}$ S/m or $10^{-15}$ S/m. In addition, in the case of the dielectric material 116, its refractive index is strictly lower than the refractive index of silicon. For example, in this embodiment, the dielectric material 116 is silicon dioxide ($SiO_2$). The layer 3 mainly extends in a horizontal plane. The layer 3 is located directly on a rigid substrate 44.

The substrate 44 extends horizontally in a plane called the "plane of the substrate". In this exemplary embodiment, the substrate 44 is a carrier the thickness of which is typically larger than 200 µm or 400 µm. For example, the substrate 4 is a carrier made of silicon which is 725 µm.

In the layer 3, the single-crystal silicon extends vertically from a horizontal lower plane to the interface between the layer 3 and a layer 20 made of dielectric material located directly above the layer 3. This horizontal lower plane is located above the interface between the layer 3 and the substrate 44. Thus, the single-crystal silicon of the layer 3 is also mechanically and electrically insulated from the substrate 44 by the dielectric material 116. For example, the thickness of single-crystal silicon in the layer 3 is comprised between 100 nm and 800 nm. Conventionally, the thickness of single-crystal silicon is equal to 65 nm or 150 nm or 300 nm or 500 nm. In this example, the thickness of the single-crystal silicon in the layer 3 is equal to 300 nm.

The electrode 120 extends, in the X-direction, from a near end 12 to a far end 11. It also extends in the Y-direction.

Here, the far end 11 is more highly doped than the near end 12. For example, the dopant concentration in the far end 11 is comprised between $10^{19}$ and $10^{21}$ atoms/cm$^3$. The dopant concentration in the near end 12 is for example comprised between $10^{17}$ and $10^{19}$ atoms/cm$^3$.

Here, the thickness $e_{12}$ of the near end 12 is equal to the thickness of the single-crystal silicon encapsulated in the layer 3. Therefore, this thickness $e_{12}$ is here equal to 300 nm.

The electrode 130 is made of III-V crystalline semiconductor doped with dopants of opposite type to that of the electrode 120. The dopant concentration of the electrode 130 is for example comprised between $10^{17}$ and $2\times10^{18}$ atoms/cm$^3$ or between $10^{17}$ and $2\times10^{19}$ atoms/cm$^3$.

The electrode 130 extends, parallel to the X-direction, from a near end 32 to a far end 31. The electrode 130 also extends in the Y-direction. The electrode 130 is located directly above the layer 20 made of dielectric material. It is therefore mechanically separated and electrically insulated from the electrode 120 by this layer 20.

The near end 32 is located facing the near end 12 and separated from this near end 12 solely by a segment 20B of the layer 20 interposed between these near ends. With respect to a vertical plane parallel to the Y- and Z-directions and passing through the near ends 12 and 32, the far end 31 is located on one side of this plane whereas the far end 11 is located on the other side. The far ends 11 and 31 do not therefore face each other.

Here, the thickness $e_{20}$ of the layer 20, and therefore the thickness of the segment 20B, is chosen to be very thin in order to obtain good capacitive coupling between the electrodes 120 and 130. To this end, the thickness $e_{20}$ is comprised between 5 nm and 35 nm. For example, the thickness $e_{20}$ is here equal to 10 nm.

The electrode 130 is entirely structured in the III-V crystalline semiconductor of a layer 30. The layer 30 is located directly on the layer 20. It comprises the III-V crystalline semiconductor encapsulated in a dielectric material 117. Here, the III-V crystalline semiconductor encapsulated in the layer 30 is the alloy InP. Inside the layer 30, the III-V crystalline semiconductor extends vertically from the interface between the layers 20 and 30 as far as to an upper horizontal plane located, in this embodiment, at the interface between the layer 30 and a layer 32 made of dielectric material.

Here, the thickness of the III-V crystalline semiconductor encapsulated in the layer 30 is equal to the thickness $e_{32}$ of the near end 32 of the electrode 130. Typically, the thickness $e_{32}$ is chosen to optimize the ratio between the optical phase shift and the optical loss of the modulator 100. To this end, the thickness $e_{32}$ is here comprised between $0.7e_{12}$ and $1.3e_{12}$. The exact value of the thickness $e_{32}$ is, for example, determined by simulating various possible values for the thickness $e_{32}$ in order to identify which of these values allows this ratio to be optimized. For example, in the present case in which the thicknesses $e_{12}$ and $e_{20}$ are equal to 300 nm and 10 nm, respectively, the thickness $e_{32}$ is chosen to be equal to 300 nm.

The region 34, which extends vertically from the far end 31 to the substrate 44, solely comprises solid dielectric materials. Here, it is a question of the dielectric material 116 and of the dielectric material of the layer 20. By virtue thereof, the parasitic capacitance between this end 31 and the substrate 44 is greatly decreased. This region 34 is, for example, identical to that described in patent application US2017237229A1.

The superposition, in the Z-direction, of the near end 12, of the segment 20B of the layer 20 and of the near end 32 is dimensioned to form a waveguide 70 capable of guiding, in the Y-direction, the optical signal generated by the laser source 7. The waveguide 70 is typically optically connected to the laser source 7 by other waveguides and other couplers structured in the layer 3. To simplify FIG. 1, these other waveguides and other couplers have not been shown.

The modulator 100 also comprises two contacts 21 and 22, making mechanical and electrical contact directly with the far ends 11 and 31, respectively. These contacts 21 and 22 are connected to a voltage source that is controllable depending on the data bit or bits to be transmitted by the transmitter 5.

Typically, the laser source 7 is a DBR (distributed Bragg reflector) laser or DFB (distributed feedback laser). Such a laser source is well known and only details required to understand the invention are described here. For example, for general details and a description of the operation of such a laser source, the reader may refer to the following articles:

B. Ben Bakir et al., "Hybrid Si/III-V lasers with adiabatic coupling", 2011.

B. Ben Bakir, C. Sciancalepore, A. Descos, H. Duprez, D. Bordel, L. Sanchez, C. Jany, K. Hassan, P. Brianceau, V. Carron, and S. Menezo, "*Heterogeneously Integrated III-V on Silicon Lasers*", Invited Talk ECS 2014.

To simplify FIG. 1 and the following figures, only one hybrid laser waveguide 200, 220 of the laser source 7 and one surface grating coupler 8 have been shown.

Such a coupler 8 is for example described in the following article: F. Van Laere, G. Roelkens, J. Schrauwen, D. Taillaert, P. Dumon, W. Bogaerts, D. Van Thourhout and R. Baets, «Compact grating couplers between optical fibers and Silicon-on-Insulator photonic wire waveguides with 69% coupling efficiency". Here, this coupler 8 is entirely structured in the single-crystal silicon of the layer 3.

The hybrid laser waveguide 200, 220 consists of a waveguide 200 made of a III-V gain medium and of a waveguide 220. Generally, the waveguide 200 is used to generate and amplify an optical signal inside an optical cavity of the laser source 7. Here, to this end, it is formed in a layer 36 comprising a III-V gain medium encapsulated in a dielectric material 136. For example, the material 136 is made of silicon dioxide or of silicon nitride. This layer 36 extends horizontally directly over the layer 32 made of dielectric material.

The layer 36 typically comprises a doped lower sublayer 38, a stack 40 of quantum wells or quantum dots made of a quaternary compound and an upper sublayer 42 doped with a dopant of opposite type to that of the sublayer 38. Sublayers 38 and 42 are for example here made of n- or p-doped single-crystal InP alloy. In this case, the stack 40 is, for example, a stack of an alternation of sublayers made of InGaAsP or of AlGaInAs, inter alia.

In FIG. 1, only a band 238, a stack 240 and a band 242 produced in the sublayer 38, the stack 40 and the sublayer 42, respectively, have been shown. This superposition of the band 238, of the stack 240 and of the band 242 forms the waveguide 200.

The waveguide 200 also comprises:

contacts 243G and 243D making mechanical and electrical contact directly with the band 238 and located on the left and right of the stack 240, respectively, and a contact 244 making mechanical and electrical contact directly with the band 242.

These contacts 243G, 243D and 244 allow an electrical current to be injected into the waveguide 200 made of III-V gain medium between the contacts 243G, 243D and the contact 244.

The waveguide 220 extends under the waveguide 200. It is separated from the waveguide 200 by the layer 32 made of dielectric material. In FIG. 1, the waveguide 220 has been shown, by way of illustration, in the case where the direction of propagation of the optical signal inside this waveguide is parallel to the Y-direction. In this embodiment, the waveguide 220 comprises:

a top portion 222 produced at least partially in the layer 30, and a bottom portion 223 produced entirely in the layer 3.

Here, the waveguide 220 is a rib waveguide. Thus, in the cross section of this waveguide, parallel to the XZ-plane, the top portion 222 forms the strip and the bottom portion 223 forms the slab of the waveguide 220.

In this embodiment, the thickness $e_{223}$ of the portion 223 is equal to the thickness $e_{12}$, i.e. to 300 nm.

The waveguide 220 is separated from the band 238 solely by a segment 32A of the layer 32.

The waveguide 220 is optically connected to the waveguide 200 by adiabatic coupling. For a detailed description of adiabatic coupling, the reader may refer to the following article: Amnon Yariv et al., 'Supermode Si/III-V hybrid Lasers, optical amplifiers and modulators: proposal and analysis', Optics Express 9147, vol. 14, No. 15, 23, Jul. 2007.

The characteristics of the optical coupling between the waveguide 220 and the waveguide 200 especially depend on:

the dimensions of the waveguide 220 and, in particular, on the thickness $e_{222}$ of the top portion 222, and the thickness $e_{32A}$ of dielectric material in the segment 32A of the layer 32 interposed between the waveguides 200 and 220.

It is therefore important for the thicknesses $e_{222}$ and $e_{32A}$ to be able to be adjusted independently of the dimensions of the other photonic components produced on the same substrate 44. Here, the thickness $e_{32A}$ is equal to the thickness of the layer 32 and may therefore be adjusted independently of the thickness $e_{20}$.

To optimize the operation of the laser source 7, the thickness $e_{32A}$ is larger than 40 nm and, typically, comprised between 40 nm and 1 μm or between 40 nm and 500 nm or between 50 nm and 150 nm or between 50 nm and 140 nm. By way of illustration, here, the thickness $e_{32A}$ is equal to 100 nm.

With such a thickness $e_{32A}$ being chosen, the coupling between the waveguides 200 and 220 is adiabatic. Under these conditions, preferably only the waveguide 220 has tapered ends in order to ensure a good exchange of optical power between the waveguides 200 and 220.

Again to optimize the operation of the laser source 7, the thickness $e_{222}$ is larger than or equal to 200 nm or 300 nm. Preferably, the thickness $e_{222}$ is larger than or equal to the thickness $e_{32}$ of the electrode 130. Here, the thickness $e_{222}$ is equal to $e_{20}+e_{32}$. Thus, here, the thickness $e_{222}$ is equal to 310 nm.

The following is one way in which the transmitter 5 may operate. The laser source 7 generates an optical signal. At least one portion of this optical signal is directed toward a Mach-Zehnder interferometer at least one of the branches of which comprises the modulator 100. This portion of the optical signal is therefore guided by the waveguide 70 before being recombined with another portion of the optical signal guided by the other branch of the Mach-Zehnder interferometer to form the modulated optical signal.

A process for fabricating the transmitter 5 will now be described with reference to FIGS. 2 to 11. FIGS. 3 to 11 show various states of fabrication of the transmitter 5 in vertical cross section parallel to the X- and Z-directions. To simplify these figures and the description of this process, conventional steps and operations for fabricating optical components other than those shown in FIG. 1 and required for operation of the transmitter 5 have been omitted.

Figure 3:
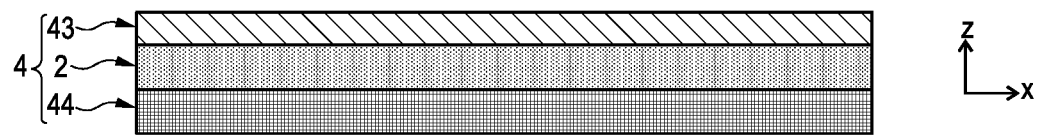
FIGS. 3 to 11 are schematic illustrations, in vertical cross section, of various fabricating states obtained during the implementation of the process of FIG. 2.
Figure 4:
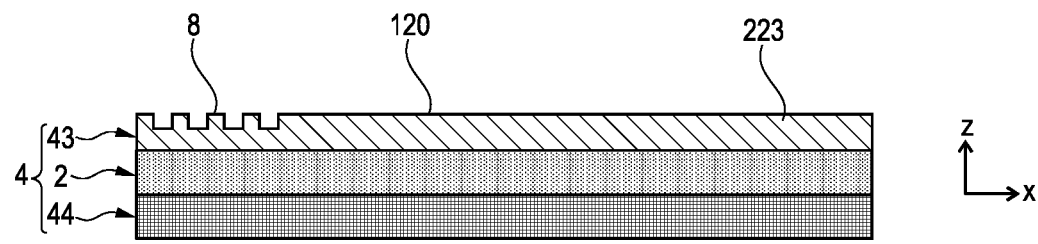

In a step 500, the process starts with provision of a substrate 4 (FIG. 3). Here, this substrate 4 is a silicon-on-insulator (SOI) substrate. The substrate 4 comprises, stacked directly on top of one another, in the Z-direction:

the silicon carrier 44, with a thickness larger than 400 μm or 700 μm conventionally, a buried layer 2 of silicon dioxide, and a layer 43 made of single-crystal silicon that, at this stage, has not yet been etched nor encapsulated in a dielectric material.

Conventionally, the thickness of the layer 2 is larger than or equal to 75 nm or 90 nm. For example, the thickness of the layer 2 is larger than 500 nm or 1 μm and, generally, smaller than 3 μm or 5 μm. In this exemplary embodiment, the thickness of the layer 2 is equal to 800 nm.

The thickness of the layer 43 is here equal to the thickness $e_{12}$ or $e_{223}$. It is therefore equal to 300 nm.

In a step 502, the guides 3 and 20 are produced. To do this, the layer 43 is etched to structure the various portions of the optical components located inside the layer 3. Thus, in this step 502, the bottom portion 223 of the waveguide 220, the electrode 120 and the surface grating coupler 8 are structured in the layer 43 of single-crystal silicon.

For example, in an operation 514, the layer 43 undergoes a first partial localized etch (FIG. 4) to thin the thickness of the silicon in the locations required for the production of the surface grating coupler 8. At the end of the operation 514, the thinned regions have a thickness smaller than the thickness $e_{12}$.

In contrast, in this operation 514, other "non-thinned" regions have not been etched and preserve their initial thickness. In particular, these non-thinned regions are located in the location of the bottom portion 223 and in the location of the electrode 130.

Figure 5:
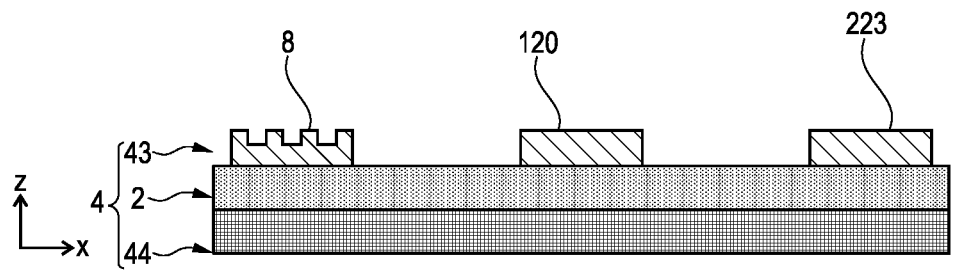

In an operation 516, a complete localized etch of the layer 43 is carried out (FIG. 5). Contrary to the partial etch, the complete etch completely removes the thickness of silicon of the layer 43 in the unmasked regions to which it is applied. In contrast, masked regions protect the layer 43 from this complete etch. This complete etch is carried out so as to structure, simultaneously, in the layer 43, the electrode 120, the bottom portion 223 and the surface grating coupler 8. To this end, only the regions corresponding to these various elements are masked. The state shown in FIG. 5 is reached at the end of this step.

In an operation 518, localized doping operations are carried out to obtain the various doping levels desired for the near end 11 and far end 12 of the electrode 120. Since these localized doping operations are conventional, they are not described here. Preferably, the electrode 120 is p-doped. Here, it is doped by ion implantation of boron.

Figure 6:
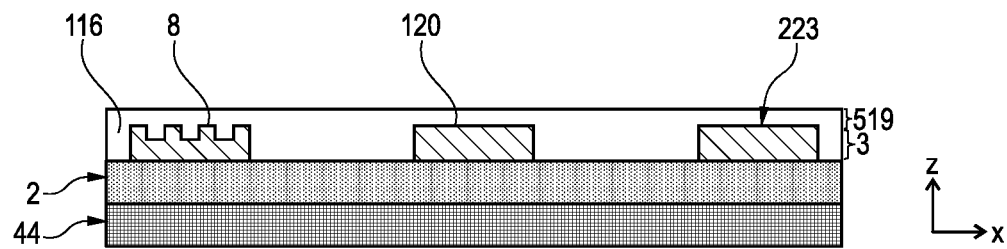

In an operation 520, the layer 43 of single-crystal silicon, which was structured in the preceding steps, is encapsulated in the dielectric material 116 (FIG. 6). At the end of the operation 518, the layer 3 is obtained. At this stage, the layer 3 is covered with a horizontal layer 519 made of dielectric material 116 the thickness of which is larger than the thickness $e_{20}$ of the layer 20.

Figure 7:
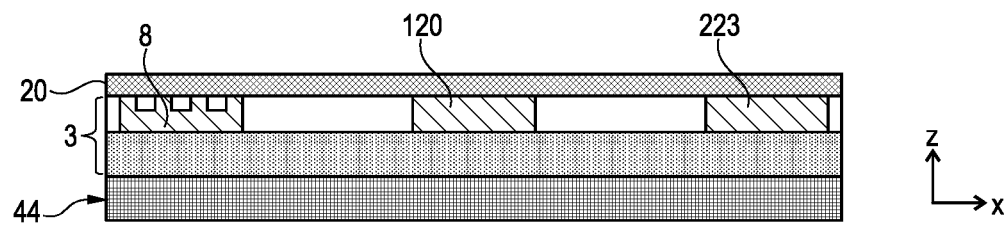
Figure 8:
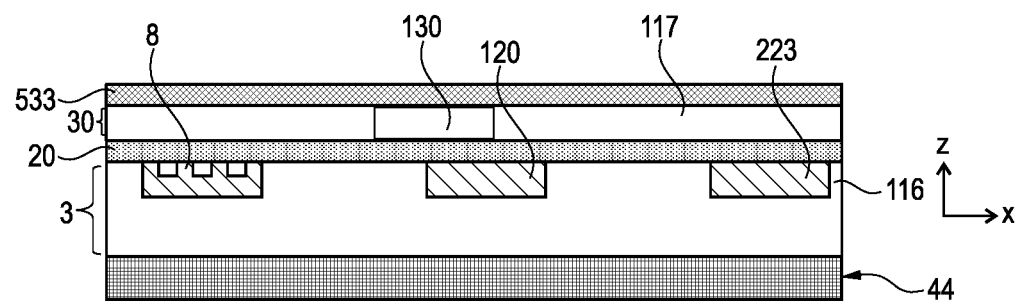
Figure 9:
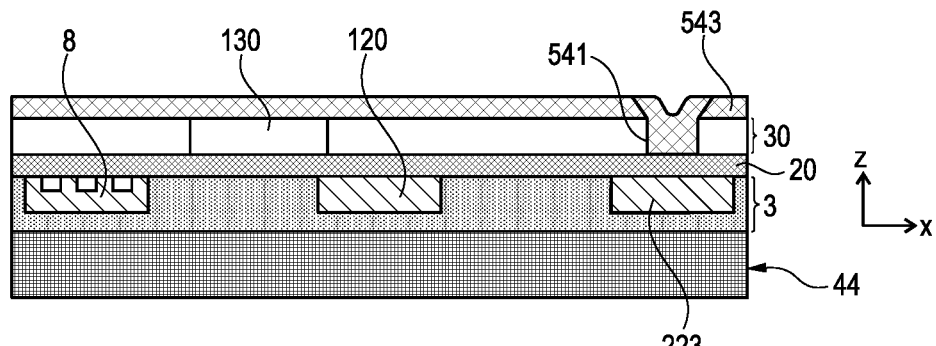

Next, in an operation 522, the layer 519 is thinned to obtain the layer 20 located on the layer 3 (FIG. 7). In the operation 522, the upper face of the layer 20 is also prepared for bonding, for example direct bonding or molecular bonding i.e. bonding without addition of material. For example, the operation 522 is carried out by polishing the upper face of the material 116 using a process such as chemical-mechanical polishing (CMP).

Next, in a step 527, the layer 30 is fabricated on the layer 20.

For example, in an operation 528, the electrode 130 is produced on the upper face of the layer 20. Here, the electrode 130 is produced by direct bonding of a transfer or a substrate made of III-V semiconductor to the layer 20 in the location in which the electrode 130 must be produced. Next, the bonded III-V semiconductor is first thinned via a sequence either mechanically using a grinder (grinding) then chemically using a solution that is selective with respect to a stop layer in the bonded III-V stack, or solely using chemical means. The remaining layer of III-V semiconductor is then structured, for example by dry or wet etching, to obtain the electrode 130. The production of the electrode 130 by bonding and structuring III-V semiconductor is conventional and is not described in more detail here. For example, the interested reader may consult the following articles for examples of such operations:

H. Duprez et al.: "1310 *nm hybrid InP/InGaAsP on silicon* distributed feedback laser with high side-mode suppression ratio", Optic Express 23(7), pp. 8489-8497 (2015), J.-H. Han et al.: "Efficient low-loss InGaAsP/Si hybrid MOS optical modulator," Nature Photonics 11, pp. 486 (2017).

In an operation 532, the electrode 130 is encapsulated in the dielectric material 117. The layer 30 covered with a horizontal layer 533 (FIG. 8) made of dielectric material the thickness of which is larger than the thickness $e_{32}$ of the layer 32 is then obtained.

Next, in an operation 534, the layer 533 is thinned to obtain the thickness desired for the layer 30. For example, here, the thickness of the layer 30 is equal to the thickness of the electrode 130, i.e. equal to the thickness $e_{32}$. In this case, at the end of the operation 534, the electrode 130 is flush with the upper face of the layer 30 and the layer 533 has been completely removed. The operation 534 is for example carried out as the operation 522 described above.

Next, in a step 540, the top portion 222 of the waveguide 220 is fabricated. Here, the top portion 222 is formed using a damascene process. This process is for example described with reference to FIG. 3 of the following article: P. Dong et al.: "Novel integration technique for silicon/III-V hybrid laser", Optics Express 22(22), Vol. 22, No 22, pp. 26861, 2014.

Figure 10:
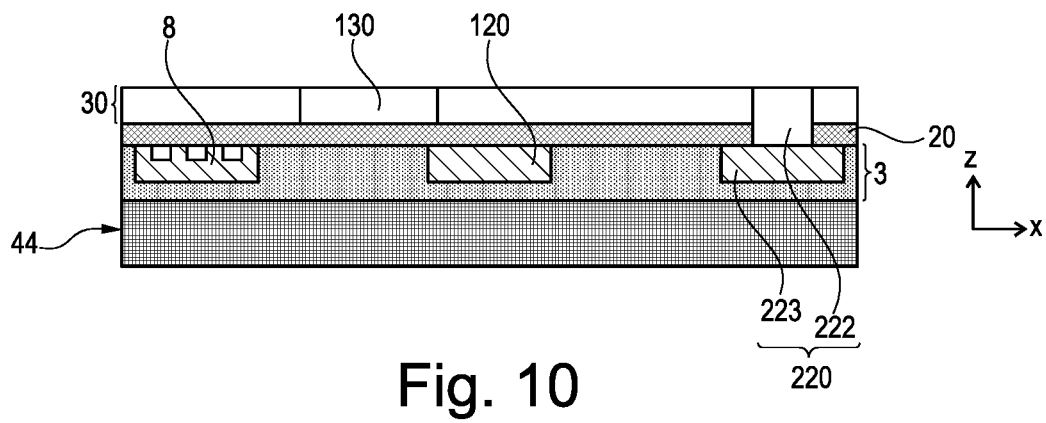

To summarize, it consists in forming a trench 541 (FIG. 9) in the location in which the top portion 222 must be produced. In this exemplary embodiment, the bottom of the trench opens directly onto the bottom portion 223. Thus, the trench 541 formed passes right through the layers 30 and 20. Next, silicon, here amorphous silicon 543 is deposited inside this trench. Generally, in this operation, amorphous silicon is also deposited on the surface of the layer 30. Lastly, a polishing operation allows the excess amorphous silicon that was deposited above and/or beside the trench to be removed. The state shown in FIG. 10 is then reached.

Figure 11:
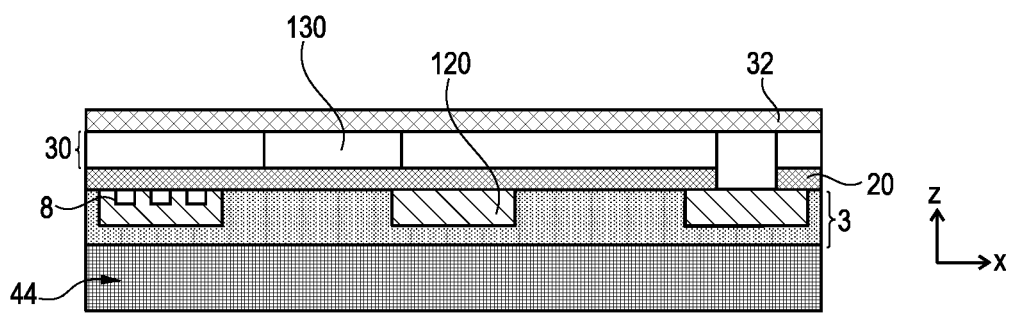

Next, in a step 544, the layer 32 is produced on the upper face of the layer 30. For example, a layer made of dielectric material, with a thickness larger than the thickness $e_{32}$, is deposited directly on this upper face. Next, this layer made of dielectric material is thinned to obtain the layer 32 located on the layer 30 (FIG. 11). Step 544 is for example carried out as described for the operation 522. The upper face of the layer 32 is thus also prepared for direct bonding.

In a step 546, the layer 36 is fabricated on the layer 32.

In an operation 548, the waveguide 200 is produced on the upper face of the layer 32. Here, the waveguide 200 is produced by direct bonding a stack made of III-V gain medium. The production of the waveguide 200 by bonding and structuring stacks of III-V semiconductor is conventional and is not described in more detail here. For example, the interested reader may consult the following articles for examples of such operations:

H. Duprez et al.: "1310 nm hybrid InP/InGaAsP on silicon distributed feedback laser with high side-mode suppression ratio", Optic Express 23(7), pp. 8489-8497 (2015), J.-H. Han et al.: "Efficient low-loss InGaAsP/Si hybrid MOS optical modulator," Nature Photonics 11, pp. 486 (2017).

In an operation 550, the waveguide 200 is encapsulated in the dielectric material 136. The layer 36 comprising the III-V gain medium encapsulated in the dielectric material 136 is then obtained.

Lastly, in a step 552, the contacts 21, 22, 243G and 243D are produced. The transmitter 5 such as shown in FIG. 1 is then obtained.

Section II: Variants

Variants of the Electrode 120:

In another embodiment, the electrode 120 comprises an intermediate portion located between the near end 12 and far end 11 and the thickness of which is smaller than the thickness $e_{12}$. This intermediate portion is, for example, separated from the layer 20 by a recess filled with a dielectric material. Typically, the recess is filled with the material 116. The bottom of this recess is essentially horizontal and spaced apart from the layer 20 by a depth $P_{578}$. The depth $P_{578}$ is typically larger than 50 nm or 100 nm. This configuration of the intermediate portion allows better control of the width of the waveguide 70. Such a configuration of the intermediate portion and the fabrication thereof are described in patent application US2017237229A1. It is therefore not described in more detail here.

In one variant, the doping of the near end 12 and of the far end 11 are the same. Thus, during the fabrication of the electrode 120, only a single step of doping the layer 43 made of single-crystal silicon is required.

The electrode 120 may also be n-doped. Such n-doping is for example obtained by ion implantation of phosphorus. In this case, the electrode 130 is p-doped.

The electrode 120 may be made from another semiconductor. For example, the electrode 120 is made of SiGe alloy or via a superposition of a silicon layer and an SiGe alloy.

Variants of the Electrode 130:

The III-V semiconductor used to produce the electrode 130 may be different. For example, it may be a question of the alloy InP, of the alloy GaAs, of the alloy InGaAsP, or AlGaInAs or of a superposition of a plurality of these alloys. In particular, the electrode 130 may consist of an InGaAsP/InP stack or an InP/InGaAsP/InP stack or of an InGaAsP/InP/AlInAs stack.

In another embodiment, the electrode 130 is made of a III-V semiconductor different from that used to produce the band 238.

As a variant, inside the layer 30, the III-V crystalline semiconductor is confined between the interface between the layers 20 and 30 and an upper horizontal plane located below the interface between the layers 30 and 32. In this case, the electrode 130 is separated from the layer 32 by an additional thickness of dielectric material 117. This allows, if necessary, the thickness of the electrode 130 with respect to the thickness of the portion 222 of the waveguide 220 to be decreased. For example, to this end, in the operation 534, the layer 533 is not completely removed.

The thickness $e_{32}$ may be chosen to be different. For example, as a variant, the thicknesses $e_{12}$ and $e_{32}$ of the near ends 12 and 32, respectively, are chosen so that the point at which the maximum strength of the optical field of the optical signal that propagates through the waveguide 70 is located as close as possible to the thickness of dielectric material located inside the segment 20B. Preferably, this point M is located at the centre of the thickness $e_{20}$ of dielectric material of the segment 20B. Specifically, it is at the interfaces between the near ends 12, 32 and the dielectric material of the segment 20B that the charge carrier density is maximal when a potential difference is present between the near ends 12 and 32. This therefore improves the effectiveness of the modulator 100. For example, to this end, in the case where the refractive indices of the near ends 12 and 32 are close to each other, the thicknesses $e_{12}$ and $e_{32}$ are chosen to be substantially equal. For example, the thickness $e_{12}$ is comprised between $0.5e_{32}$ and $1.5e_{32}$, and preferably, between $0.7e_{32}$ and $1.3e_{32}$.

Variants of the Waveguide 220:

The portion 223 of the waveguide 220 may be made from another semiconductor. For example, when the electrode 120 is made of SiGe alloy or via a superposition of a silicon layer and an SiGe alloy, the portion 223 is made from the same semiconductor.

The top portion 222 may also be made from a semiconductor other than silicon and, optionally, made of a semiconductor different from that used to produce the bottom portion 223. For example, as a variant, the top portion 222 is made from the same material as that used to produce the electrode 130. In this case, preferably, the top portion 222 is manufactured and structured at the same time and using the same operations as those employed to fabricate the electrode 130. Thus, the top portion 222 is made of III-V semiconductor transferred by direct bonding to the layer 20. The top portion 222 is therefore separated from the bottom portion 223 by the layer 20. Given that the layer 20 is very thin, this does not modify the capacity of the waveguide 220 to effectively guide the optical signal.

Other configurations of the waveguide 220 are possible. For example, as a variant, the width, in the X-direction, of the portion 223 is equal to the width of the portion 222. In this case, the waveguide 220 is a strip waveguide. In another embodiment, the width, in the X-direction, of the portion 222 is larger than the width of the portion 223. In this case, the waveguide 220 is still a rib waveguide but the positions of the strip and of the slab are inverted with respect to the embodiment of FIG. 1. As a variant, the portion 223 of the waveguide 220 is omitted. In this case, the waveguide 220 is entirely produced inside the layers 20 and 30 or only inside the layer 30.

Other Variants of the Modulator:

The modulator 100 may also be a ring modulator. To this end, the waveguide 70 loops back on itself to form a ring waveguide in which the charge carrier density may be modified depending on the potential difference applied across the contacts 21 and 22. Typically, this ring waveguide is connected to a waveguide to which the optical signal to be modulated propagates by evanescent coupling. The waveguide 70 may thus form only a limited segment of the ring waveguide.

In another embodiment, the modulator is used to modulate the intensity of the optical signal passing therethrough. Specifically, a modification of the charge carrier density in the waveguide 70 also modifies the intensity of the optical signal passing therethrough.

In another variant, the layer 20 is completely removed anywhere where it is not indispensable to the operation of the transmitter. For example, it is completely removed outside the segment 20B.

Whatever the embodiment, it is possible to invert the n- and p-doped regions.

Variants of the Laser Source:

In one variant, the layer 32 is completely removed anywhere where it is not indispensable to the operation of the transmitter. For example, it is completely removed outside the segment 32A.

Other III-V gain mediums may be used to produce the laser source 7. For example, the layer 36 is formed from the following stack from bottom to top:
a lower sublayer made of n-doped GaAs,
sublayers containing quantum dots made of AlGaAs, or AlGaAs quantum wells, and
an upper sublayer made of p-doped GaAs.

Variants of the Fabricating Process:

Step 502 of producing the layers 3 and 20 may comprise other etching operations. For example, the step 502 comprises an additional etching operation to thin the bottom portion 223 of the waveguide 220 of the laser source. In this case, the thickness $e_{223}$ is smaller than the thickness $e_{12}$ of the electrode 120. In another variant, it is the electrode 120 that is thinned to obtain a thickness $e_{12}$ smaller than the thickness $e_{223}$.

In another variant, the localized complete etching operation 516 is replaced by a uniform etch of the entire area of the layer 43, so as to convert the non-thinned regions into thinned regions and to completely remove the thinned regions.

The doping operation 580 may also be carried out before the etching operations 514 and 516. In another embodiment, the operation 518 is carried out at the same time as one of the etching operations.

The dielectric layer 20 may be obtained using various fabricating processes. For example, in the operation 522, the layer 519 is completely removed down to the layer 3, then the layer 20 is deposited on the uncovered layer 3. In this case, optionally, the dielectric material of the layer 20 may be different from the material 116. For example, it may be a question of a dielectric material such as an electrically insulating polymer or $Al_2O_3$. After the complete removal of the layer 519, it is also possible to produce the layer 20 by oxidation of the surface of the layer 3.

Before the bonding of the electrode 130, the layer 20 is produced on the lower face of the transfer made of III-V crystalline semiconductor. For example, the layer 20 is obtained by oxidizing the III-V semiconductor or by depositing dielectric on the face of the III-V semiconductor to be bonded. Next, the layer 20 formed on the transfer made of III-V semiconductor is bonded, by direct bonding, to the upper face of the layer 3. The process for fabricating the transmitter 5 then continues with the operation 528 of structuring the electrode 130 in the transfer made of III-V semiconductor bonded to the layer 3.

Other embodiments of the step 540 for producing the top portion 222 are possible. For example, the trench 541 does not open onto the bottom portion 223 and the bottom of the trench is located, for example, at the interface between the layers 20 and 30. In this case, the top portion 222 is mechanically separated from the bottom portion by the layer 20. However, as indicated above, given that the layer 20 is very thin, this in no way adversely affects the operation of the waveguide 220.

In another variant, the bottom portion 223 is not produced in step 502 but in step 540. To this end, in step 540, the bottom of the trench is located inside the layer 3. Thus, in this case, the top portion 222 and the bottom portion 223 are produced at the same time when the trench is filled with semiconductor.

The trench 541 may be filled using processes other than the damascene process. For example, when the bottom of the trench 541 opens onto the bottom portion 223 made of single-crystal silicon, the trench 541 may be filled by epitaxial growth of single-crystal silicon from the bottom portion 223.

Other Variants:

Other dielectric materials may be used for the materials 116, 117, 136 and the layers 20 and 32. For example, it may be a question of silicon nitride, aluminium nitride, and electrically insulating polymer, or $Al_2O_3$. In addition, in the case of the layers 20 and 32, its refractive index is not necessarily lower than that of silicon.

As a variant, a portion or the entirety of the contacts are produced, not through the material 136, but through the substrate 44. In this case, with respect to what was shown in the preceding figures, one or more electric contacts emerge under the substrate.

The substrate 44 may be made of a material other than silicon.

As a variant, the waveguides 70, 220 are curved. In this case, the configuration of the various elements optically coupled to these waveguides is matched to the radius of curvature of these waveguides.

Section III: Advantages of the Described Embodiments

The thickness of dielectric material larger than 40 nm in the segment 32A allows adiabatic coupling between the waveguide 220 and the waveguide 200 instead of evanescent coupling to be obtained. Adiabatic coupling is simpler to achieve than evanescent coupling. Advantageously, in the case of adiabatic coupling, it is not necessary to structure tapers in the waveguide 200, made of III-V semiconductor. In contrast, in the case of evanescent coupling, tapers must be structured in the waveguide 200. Now, to structure tapers in a waveguide made of III-V semiconductor is an operation that is complex to perform, depending on the thickness and crystal orientation thereof. Thus, the fact that the thickness of dielectric material between the waveguides 200 and 220 is larger than 40 nm simplifies the fabrication of the transmitter. In particular, because of this, the transmitter 5 it is simpler to fabricate than that described in patent application US2017237229A1.

The fact that the thickness of dielectric material between the two electrodes 120 and 130 is smaller than 35 nm allows a capacitive modulator to be produced. If the thickness of dielectric material between the two electrodes 120 and 130 were larger, only an electro-absorption modulator (EAM) would be producible. However, capacitive modulators have a bandwidth, i.e. a useful wavelength range, much broader then electro-absorption modulators.

The fact that the thicknesses of dielectric material between the waveguides 200 and 220 and between the electrodes 120 and 130 are different allows a transmitter that has, at the same time, the above various advantages, i.e. one that is not only simple to manufacture but also incorporates, on the same substrate, a laser source and a capacitive modulator the performance of each of which, i.e. of both the laser source and the capacitive modulator, is optimized, to be obtained.

Hybrid capacitive modulators are also advantageous with respect to non-hybrid capacitive modulators in which the electrode 130 is also made of silicon. Specifically, hybrid capacitive modulators allow phase changes to be obtained ten times to one hundred times more effectively than with a non-hybrid capacitive modulator. Thus, the described transmitters have a performance that is equal to or better than that of the transmitter of patent application US2017237229A1.

The fabricating processes described here allow the thickness of the dielectric material in the section 20A of the layer 20 to be adjusted independently of the thickness of dielectric material in the segment 32B of the layer 32. The described processes therefore allow, on the same substrate, both a semiconductor laser source and a capacitive modulator that are optimized independently of each other to be fabricated.

The fabricating process described here in particular has the following advantages:

It allows the thickness of the layer 20 to be controlled independently of the thickness of the layer 32.

It is not necessary to flip the substrate 44 to bond the layer 20 to another substrate.

It allows the thickness of the electrode 120 to be precisely adjusted independently of the thickness of the waveguide 220 and, more generally, independently of the thickness of the layer 43 made of single-crystal silicon. This is particularly useful because, generally, to improve the operation of the laser source 7, it is necessary for the thickness of the waveguide 220 to be quite large, i.e. here about 500 nm. In contrast, to improve the operation of the modulator 100, as explained above, the thickness of the electrode 120 and, in particular of its near end 12, is generally smaller than the thickness $e_{222}$.

This process allows the formation of a parasitic capacitor under the far end 31 to be avoided and therefore the modulator 100 to operate more rapidly.

The invention claimed is:

1. A photonic transmitter, comprising:
a stack comprising a substrate mainly extending in a plane and the following layers successively stacked one on top of the other and each extending mainly parallel to the plane of the substrate:
a first layer located directly on the substrate and comprising a first crystalline semiconductor encapsulated in a dielectric material, the first crystalline semiconductor being chosen from the group consisting of single-crystal silicon, the alloy SiGe and a superposition of single-crystal silicon and SiGe alloy,
a second layer made of dielectric material located directly on the first layer, the thickness of the second layer being comprised between 5 nm and 35 nm,
a third layer located directly on the second layer and comprising a second crystalline semiconductor encapsulated in a dielectric material,
a semiconductor laser source configured to generate an optical signal, the laser source comprising a first waveguide and a second waveguide made of III-V gain medium, the first and second waveguides being optically coupled to each other through a layer made of dielectric material,
a phase and/or amplitude modulator produced on the same substrate and configured to modulate the optical signal generated by the semiconductor laser source, the modulator comprising:

a p- or n-doped first electrode structured in the first crystalline semiconductor of the first layer, a doped second electrode structured in the second crystalline semiconductor of the third layer, the second electrode being doped with dopants of opposite type to that of the first electrode and being separated from the first electrode only by the second layer, wherein:

the stack comprises:

a fourth layer made of dielectric material located directly on the third layer, the fourth layer forming said dielectric layer through which the first and second waveguides of the laser source are optically coupled to each other, the thickness of the fourth layer being comprised between 40 nm and 1 μm in order to obtain an adiabatic coupling between the first and second waveguides, and a fifth layer located directly on the fourth layer and comprising a III-V gain medium encapsulated in a dielectric material, the second waveguide of the laser source being entirely structured in the III-V gain medium of the fifth layer, and the first waveguide of the laser source comprises a first portion made of semiconductor located inside the third layer and that extends, in a direction perpendicular to the plane of the substrate, to the interface between the third and fourth layers.

2. The transmitter according to claim 1, wherein:

the second crystalline semiconductor of the third layer extends directly over the second layer, the first electrode of the modulator extends, in a transverse direction parallel to the plane of the substrate, from a near end to a far end, and extends longitudinally in the direction of propagation of the optical signal, the second electrode of the modulator extends, in the transverse direction, from a near end located facing the near end of the first electrode to a far end located on a side opposite the far end of the first electrode with respect to a plane perpendicular to the plane of the substrate and passing through the near ends, the second electrode also extending longitudinally in the direction of propagation of the optical signal, the modulator also comprises contacts making direct mechanical and electrical contact with the far ends of the electrodes, respectively, with a view to electrically connecting the first and second electrodes to different electrical potentials so as to modify the charge carrier density inside a third waveguide formed by the superposition of the near ends of the electrodes and a segment of the second layer interposed between these near ends.

3. The transmitter according to claim 2, wherein the maximum thickness of the near end of the second electrode is strictly smaller than the maximum thickness of the first portion of the first waveguide.

4. The transmitter according to claim 3, wherein the first waveguide of the laser source also comprises a second portion structured in the first crystalline semiconductor of the first layer and the first portion passes through the second layer and extends, in a direction perpendicular to the plane of the substrate, from the second portion to the interface between the third and fourth layers.

5. The transmitter according to claim 3, wherein the maximum thickness of the near end of the second electrode is comprised between $0.7e_{12}$ and $1.3e_{12}$, where $e_{12}$ is the maximum thickness of the near end of the first electrode.

6. The transmitter according to claim 2, wherein the modulator comprises a region composed solely of one or more solid dielectric materials, which extends:

in the direction perpendicular to the plane of the substrate, from the far end of the second electrode to the substrate, and in the transverse direction and in the direction of propagation of the optical signal, under the entirety of the far end of the second electrode.

7. The transmitter according to claim 1, wherein the second crystalline semiconductor is a III-V crystalline semiconductor and, preferably, a III-V crystalline semiconductor chosen from the group consisting of the alloy InP, the alloy GaAs, the alloy InGaAsP, or a superposition of a plurality of the alloys of the group.

8. A process for fabricating a semiconductor photonic transmitter according to claim 1, the process comprising:

producing a stack comprising a substrate mainly extending in a plane and the following layers successively stacked one on top of the other and each extending mainly parallel to the plane of the substrate:

a first layer located directly on the substrate and comprising a first crystalline semiconductor encapsulated in a dielectric material, the first crystalline semiconductor being chosen from the group consisting of single-crystal silicon, the alloy SiGe and a superposition of single-crystal silicon and SiGe alloy, a second layer made of dielectric material located directly on the first layer, the thickness of the second layer being comprised between 5 nm and 35 nm, a third layer located directly on the second layer and comprising a second crystalline semiconductor encapsulated in a dielectric material, producing a semiconductor laser source configured to generate an optical signal, the laser source comprising a first waveguide and a second waveguide made of III-V gain medium, the first and second waveguides being optically coupled to each other through a layer made of dielectric material, producing a phase and/or amplitude modulator produced on the same substrate and configured to modulate the optical signal generated by the semiconductor laser source, the modulator comprising:

a p- or n-doped first electrode structured in the first crystalline semiconductor of the first layer, a doped second electrode structured in the second crystalline semiconductor of the third layer, the second electrode being doped with dopants of opposite type to that of the first electrode and being separated from the first electrode only by the second layer, wherein:

producing the stack comprises:

producing a fourth layer made of dielectric material located directly on the third layer, the fourth layer forming said dielectric layer through which the first and second waveguides of the laser source are optically coupled to each other, the thickness of the fourth layer being comprised between 40 nm and 1 μm in order to obtain an adiabatic coupling between the first and second waveguides, and producing a fifth layer located directly on the fourth layer and comprising a III-V gain medium encapsulated in a dielectric material, the second waveguide of the laser source being entirely structured in the III-V gain medium of the fifth layer, and producing the laser source comprises producing a first portion of the first waveguide, the portion being made of semiconductor and located inside the third layer and extending, in a direction perpendicular to the plane of the substrate, to the interface between the third and fourth layers.

9. The process according to claim 8, wherein producing the first portion of the first waveguide comprises:
in the location of the first portion in the third layer, producing, in the third layer, a trench the depth of which is larger than or equal to the thickness of the second electrode of the modulator, then
filling the trench with the semiconductor to form the first portion of the first waveguide.

10. The process according to claim 8, wherein producing the first waveguide of the laser source comprises:
etching the first crystalline semiconductor of the first layer to define, at the same time, the first electrode of the modulator and a second portion of the first waveguide of the laser source, then
encapsulating the first crystalline semiconductor thus etched in a dielectric material to obtain the first layer.

\* \* \* \* \*